United States Patent [19]
Pyeon

[11] Patent Number: 5,751,170
[45] Date of Patent: May 12, 1998

[54] CIRCUIT FOR LOW VOLTAGE SENSE AMPLIFIER

[75] Inventor: Hong Beom Pyeon, Seoul, Rep. of Korea

[73] Assignee: LG Semicon Co., Ltd., Cheongju, Rep. of Korea

[21] Appl. No.: 764,386

[22] Filed: Dec. 13, 1996

[30] Foreign Application Priority Data

Dec. 16, 1995 [KR] Rep. of Korea ............... 51093/1995

[51] Int. Cl.[6] .................................................. G01R 19/00
[52] U.S. Cl. ............................... 327/57; 327/51; 327/55
[58] Field of Search ............................. 327/51, 52, 54, 327/55, 57; 365/205

[56] References Cited

U.S. PATENT DOCUMENTS

| | | | |
|---|---|---|---|
| 5,023,841 | 6/1991 | Akrout et al. | 327/51 |
| 5,334,890 | 8/1994 | Hardee | 327/51 |
| 5,659,260 | 8/1997 | Kajimoto et al. | 327/55 |
| 5,666,074 | 9/1997 | Chun | 327/51 |

*Primary Examiner*—Toan Tran
*Attorney, Agent, or Firm*—Fleshner & Kim

[57] ABSTRACT

A circuit for a low voltage sense amplifier obtains a faster test time in designing a circuit because a conventional sense amplifier adopting voltage 3.3V can be applied to a semiconductor memory device requiring a potential of less than 1.0V, and prevents current leakage at a low threshold voltage by providing source voltage to a sense amplifier of a selected memory cell array in an active mode as well as in a standby mode.

6 Claims, 5 Drawing Sheets

WORD LINE

BIT LINE

NCS

PCS

SAPB

SAN

PCS

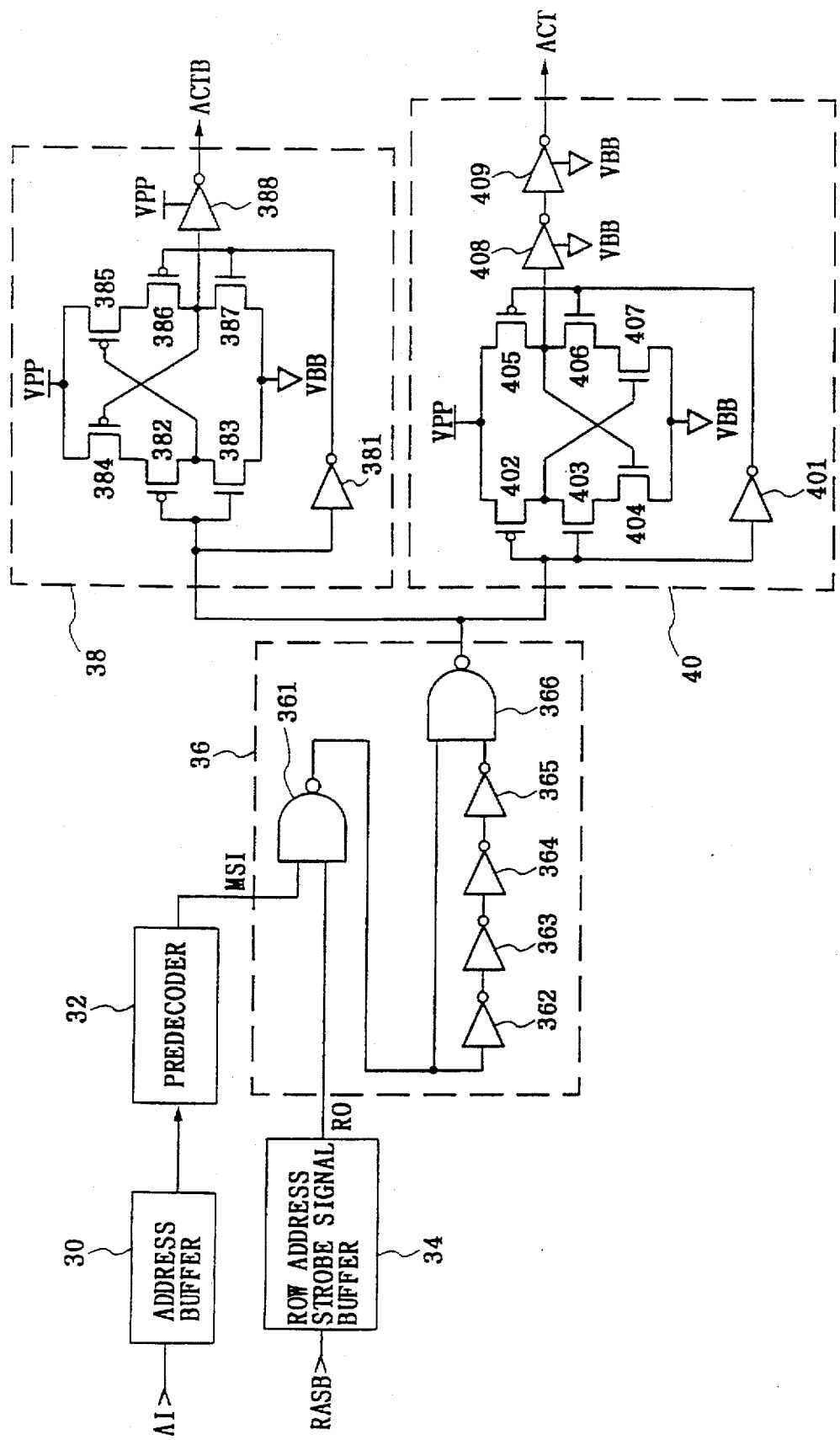

CIRCUIT FOR LOW VOLTAGE SENSE AMPLIFIER

BACKGROUND OF THE INVENTION

1. Field of the Invention

The present invention relates to a sense amplifier, and more particularly to a circuit for a sense amplifier circuit applicable to a low voltage for preventing current leakage occurring due to a low threshold voltage during an operation at less than 1.0V, and abstaining an excessive current generation in a stand-by mode, in accordance with a control circuit and a switch provided in the sense amplifier.

2. Description of the Prior Art

As shown in FIG. 1, a conventional memory cell block in a semiconductor device memory includes a plurality of memory cell arrays 10, 14, 18 each having a plurality of memory cells, a plurality of sense amplifiers 12, 16, 20 for amplifying data stored in the memory cell arrays 10,14,18 in accordance with sense amplifier driving control signals ("SAPB", "SAN") which serve to drive the sense amplifiers. Here, the sense amplifier 12 denotes a selected block, and the sense amplifiers 16, 20 denote unselected blocks, respectively.

The sense amplifiers 12, 16, 20 are respectively composed of a plurality of sense amplifying circuits each of which receives SAPB and SAN.

With reference to FIG. 2, each of the sense amplifying circuits includes: a PMOS transistor ("PMOS") 120 to the gate of which SAPB is applied, and to the source of which a supply voltage Vcc is applied; an NMOS transistor ("NMOS") 122 to the gate of which SAN is applied, and to the source of which a ground voltage Vss is applied; a plurality of sense amplifying latches 124, 126, 128 to a terminal of each of which the drain of NMOS 122 is connected by a signal line PCS, and to another terminal of each of which the drain of PMOS 120 is connected by a signal line NCS; and a precharge unit 130 for being connected to the sense amplifying latches 124, 126, 128 by the signal lines PCS, NCS, and precharging the signal lines PCS, NCS at voltage Vcc/2 in accordance with a precharge signal ("PCB") and a precharge voltage $V_{BLP}$.

The sense amplifying latch 124 includes: a pair of PMOS transistors 131, 133 to each source of which the signal line PCS is connected; an NMOS transistor 132 to the drain of which the drain of PMOS 131, the gate of PMOS 133 and a bit line BL1 are commonly connected, to the gate of which the gate of PMOS 131, the drain of PMOS 133 and a bit line BLB1 are commonly connected, and the source of which the signal line NCS is connected; and an NMOS transistor 134 to the drain of which the drain of PMOS 133 is connected, to the gate of which the gate of PMOS 133 is connected, and to the source of which the signal line NCS is connected. The other amplifying latches 126, 128 are composed identical to the sense amplifying latch 124 by being respectively connected to a corresponding one of bit line pairs (BL2, BLB2), (BL3, BLB3).

The precharge unit 130 includes: an NMOS transistor 135 to the source of which the signal line PCS is connected, and to the gate and the drain of which the precharge signal PCB and the precharge voltage $V_{BLP}$ are respectively applied; and an NMOS transistor 136 to the gate and drain of which the precharge signal PCB and the precharge voltage $V_{BLP}$ are respectively applied, and to the source of which the signal line PCS is connected.

The operation of the thusly constituted conventional sense amplifier will now be described with reference to FIG. 3.

First, the bit line pairs of the sense amplifying latches 12, 16, 20 are respectively precharged at voltage Vcc/2 before a word line is enabled, and the PMOS and the NMOS transistors to each of which SAPB and SAN are applied are respectively turned off, thereby deleting a charge gap between the bit line pairs and therefore obtaining a decreased current leakage.

The sense amplifiers 12 are selected when the bit line pairs are precharged, and a word line of the memory cell array 10 is selected so that as shown in FIG. 3A an access threshold voltage VTn of the memory cell is increased to a high voltage Vpp which is obtained by adding Vcc to the access threshold voltage (VTn×2).

As shown in FIG. 3B, when the data stored in a memory cell is loaded in the bit line pair, and as shown in FIGS. 3E and 3F when PMOS 120 and NMOS 122 are turned on in accordance with SAPB and SAN, the ground voltage Vss and the supply voltage Vcc are applied to the signal lines NCS, PCS as shown in FIGS. 3C and 3D. At this time, the precharge signal PCB is converted to a low level as shown in FIG. 3G to thereby turn on the NMOS transistors 135, 136.

The sense amplifiers 16, 20 other than the selected sense amplifiers 12 are maintained at a level of the precharge signals thereof.

However, in the thusly provided conventional sense amplifier, although a threshold voltage of the memory cell can be maintained at more than 0.5V in a case that a present operational voltage is set at 3.3V, the threshold voltage should be lowered during a sub-operation at less than 1.0V, and also the level of Vcc/2 is maintained at less than 0.5V, whereby the increased current leakage during the sub-operation at threshold voltage 0.2V decreases the time period for using chargeable or battery-operated electronic appliances such as a notebook computer or a mobile phone.

SUMMARY OF THE INVENTION

Therefore, it is an object of the present invention to provide a low voltage sense amplifier for decreasing current leakage occurring due to a low threshold voltage during an operation at less than 1.0V by adding a switch and a level shifter in the sense amplifier, thereby restraining an excessive current generation in a standby mode.

To achieve the above-described object, the low voltage sense amplifier according to the present invention includes: a PMOS transistor to a gate of which is applied a first switch control signal output from a level shifter, and to a source of which is applied a supply voltage; a plurality of PMOS transistors to a respective source of which is connected a drain of the PMOS transistor, and to a respective gate of which is applied a first sense amplifier driving control signal; a plurality of sense amplifiers to a respective terminal of which is connected a corresponding one of the plurality of PMOS transistors, and each of which includes a plurality of sense amplifying latches; a plurality of NMOS transistors to a respective gate of which is applied a second sense amplifier driving control signal, and to a respective drain of which is connected a corresponding one of the plurality of sense amplifiers; and an NMOS transistor to a gate of which is applied a second switch control signal output from the level shifter, to a drain of which is connected each of sources of the plurality of NMOS transistors, and to a source of which is connected a ground voltage.

BRIEF DESCRIPTION OF THE DRAWINGS

FIG. 4 is a block diagram of a sense amplifier according to the present invention;

FIGS. 6A–6J are timing diagrams of respective portions of FIG. 4.

DETAILED DESCRIPTION OF THE PRESENT INVENTION

Figure 1:
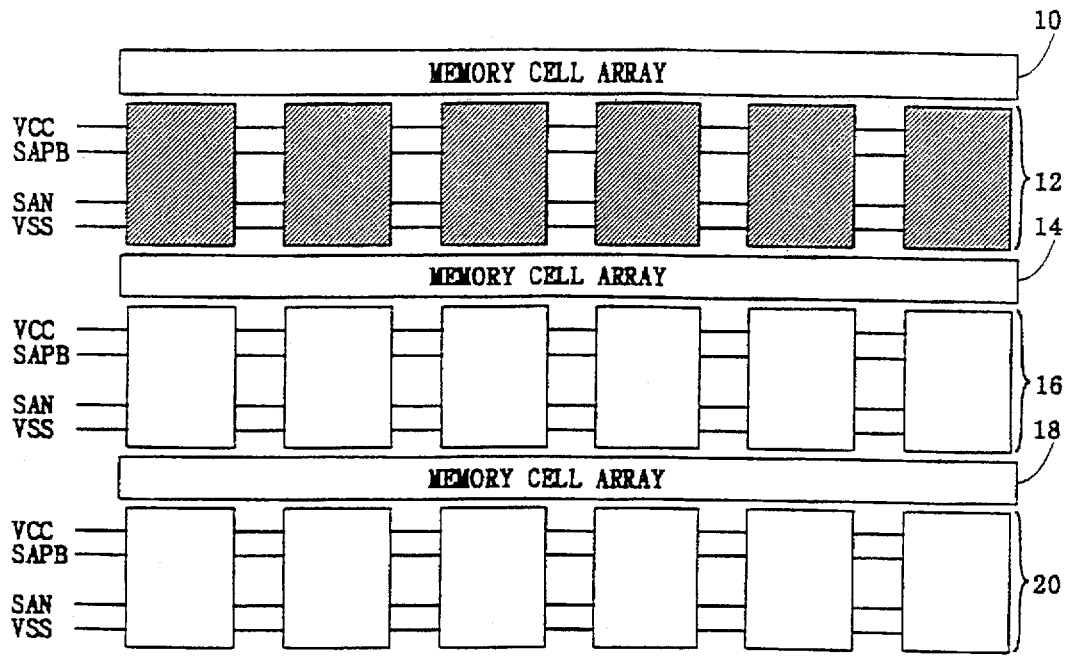
FIG. 1 is a block diagram of a conventional memory cell block according to a semiconductor memory device.
Figure 2:
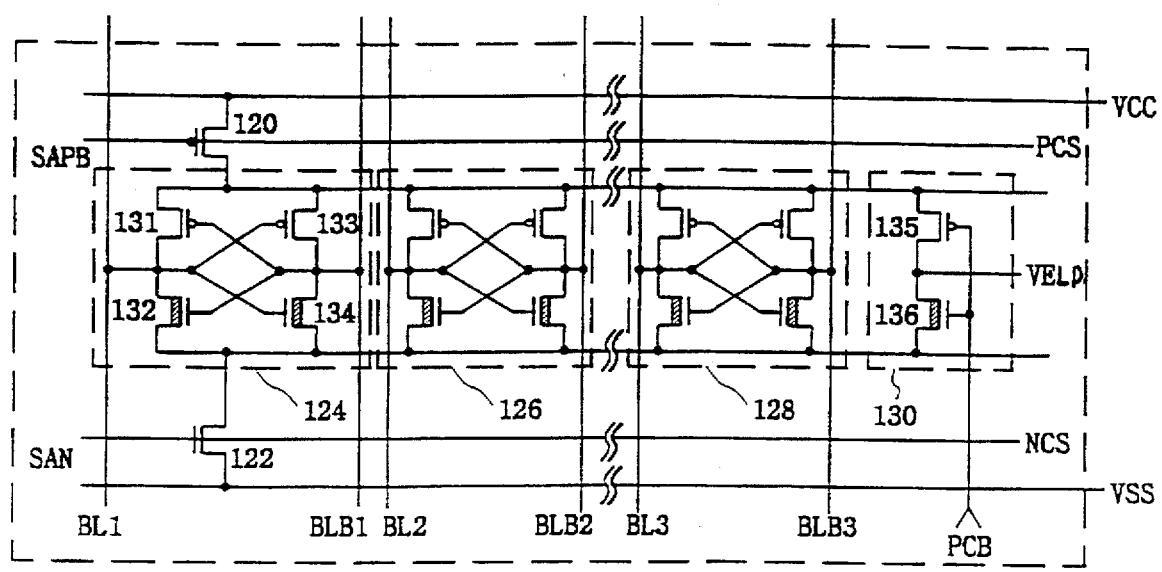
FIG. 2 is a circuit view detailing a sense amplifier in FIG. 1.
Figure 3A:
FIGS. 3A–3G are timing diagrams of input/output signals in FIG. 1.
Figure 3B:
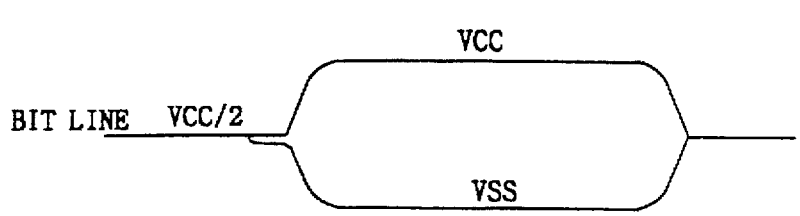
Figure 3C:
Figure 3D:
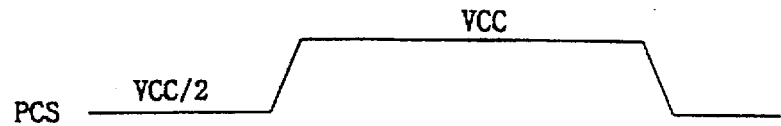
Figure 3E:
Figure 3F:
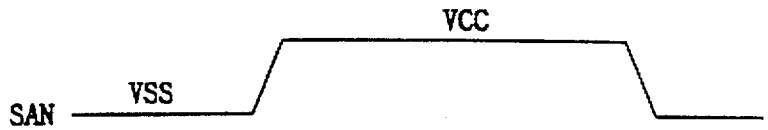
Figure 3G:

As shown in FIG. 4, a level shifter according to the present invention includes: an address buffer 30 for receiving and buffering an address signal Ai; a predecoder 32 for decoding the output signal of the address buffer 30; a row address strobe signal buffer 34 for buffering a row address strobe buffer signal ("RASB"); a logic operator 36 for logically operating an output signal RΦ of the buffer 34 and an output signal MSi of the predecoder 32; a switch control signal generator 38 for generating a switch control signal ("ACTB") in accordance with the output signal of the logic operator 36; and a switch control signal generator 40 for generating a switch control signal ("ACT") in accordance with the output signal of the logic operator 36.

The logic operator 36 includes: a NAND gate 361 for NANDing the output signal RΦ of the buffer 34d and the output signal MSi of the predecoder 32; and a NAND gate 366 for NANDing the output signal of the NAND gate 361 and a signal delayed by passing from the NAND gate 361 through serial inverters 362–365.

The switch control signal generator 38 includes: an inverter 381 for inverting the output signal of the logic operator 36; a pair of serially connected PMOS transistor 382 and NMOS transistor 383 to each gate of which the output signal of the logic operator 36 is applied; a PMOS transistor 384 to the source of which a high voltage Vpp is applied, and the drain of which is connected to the source of a PMOS transistor 368; a PMOS transistor 385 to the source of which the high voltage Vpp is applied, and the gate of which is coupled to each drain of PMOS 382 and NMOS 383; an NMOS transistor 387 and a PMOS transistor 386 to each gate of which the output signal of the inverter 381 is applied, and serially connected to PMOS 385; an inverter 388 for inverting the signal commonly applied thereto from the drain of PMOS 386, the drain of NMOS 387 and the gate of PMOS 384, thereby outputting the resultant signal.

The switch control signal generator 40 includes: an inverter 401 for inverting the output signal of the logic operator 36; a pair of serially connected PMOS transistor 402 and NMOS transistor 403 to each gate of which the output signal of the logic operator 36 is applied; an NMOS transistor 404 to the drain of which the source of NMOS 403 is connected, and to the source of which a low voltage Vbb is applied; a pair of serially connected PMOS transistor 405 and NMOS transistor 406 to each gate of which the output signal of the inverter 401 is applied; an NMOS transistor 407 to the drain of which the source of NMOS 406 is connected, to the gate of which the drain of PMOS 402 and the source of NMOS 403 are commonly connected, and to the source of which a low voltage Vbb is applied; an inverter 408 for inverting the signal commonly applied thereto from the gate of NMOS 404, the drain of PMOS 405, and the drain of NMOS 406; and an inverter 409 for inverting the output signal of the inverter 408 and outputting a switch control signal ACT.

Figure 5:
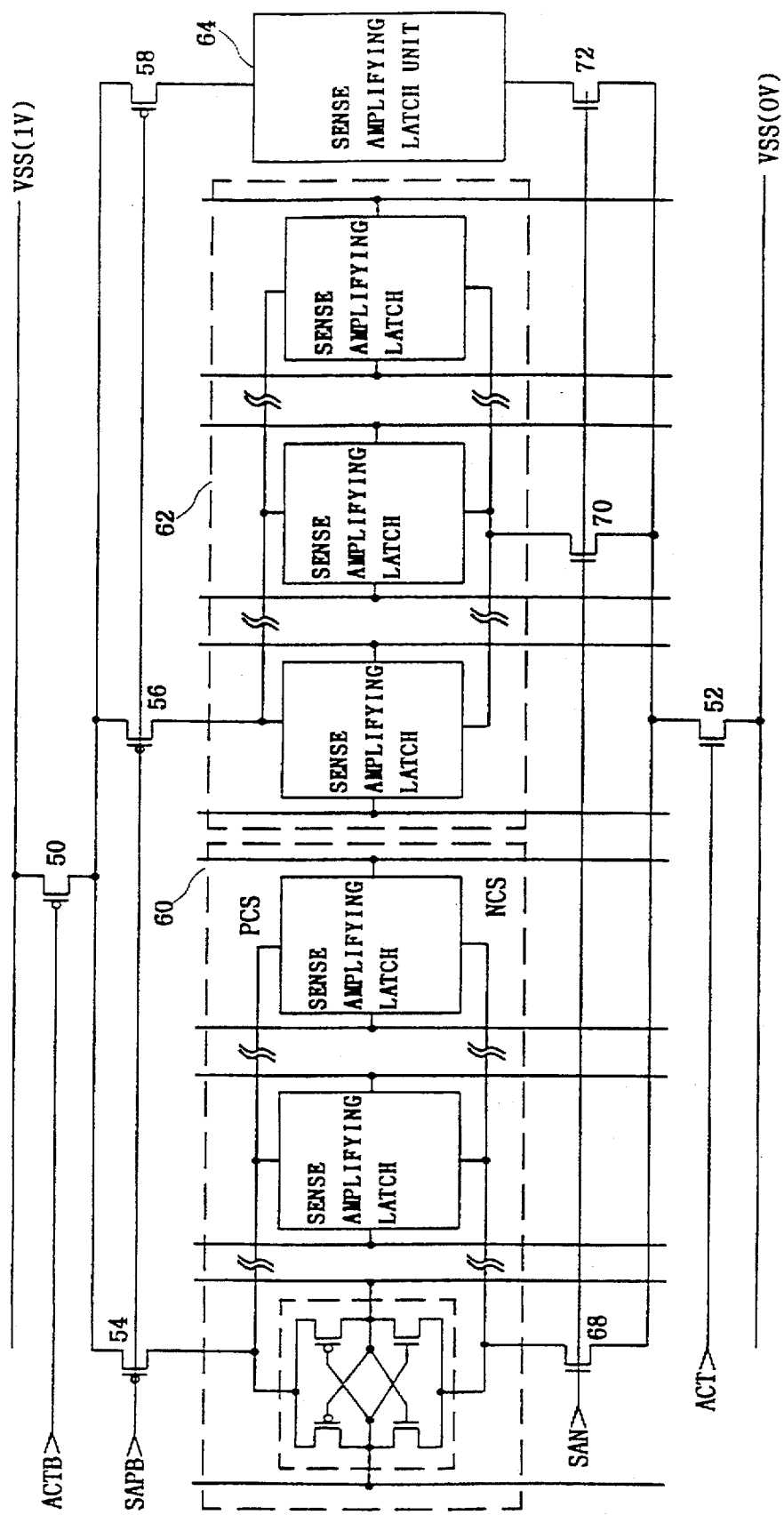
FIG. 5 is a circuit view of a level shifter according to the present invention.

As shown in FIG. 5, the low voltage sense amplifier according to the present invention includes: a PMOS transistor 50 to the gate of which the switch control signal ACTB output from the switch control signal generator 38 in FIG. 4 is applied, and to the source of which a supply voltage Vcc is applied at less than 1.0V; an NMOS transistor 52 to the gate of which the switch control signal ACT output from the switch control signal generator 40 is applied, and the source of which is connected to a ground voltage Vss; a plurality of PMOS transistors 54, 56, 58 to each gate of which the SAPB is applied, and to each source of which the drain of PMOS 50 is connected; a plurality of NMOS transistors 68, 70, 72 to each gate of which the SAP is applied, and to each source of which the drain of NMOS 52 is connected; a plurality of sense amplifying latches 60, 62, 64 to a terminal of each of which a corresponding drain of the PMOS transistors 54, 56, 58, and to another terminal of each of which a corresponding drain of the NMOS transistors 68, 70, 72, and further including a plurality of sense amplifying latches which are provided identical to the conventional art.

The operation and effects of the thusly constituted low voltage sense amplifier will now be described.

Referring to FIG. 5, in the present invention, a high voltage Vpp and a low voltage Vbb instead of a supply voltage Vcc, that is, the switch control signals ACTB, ACT are respectively applied to a corresponding one of the gates of the PMOS transistor 50 and the NMOS transistor 53.

Here, an additional circuit for generating a high voltage Vpp and a low voltage Vbb, which serve to maintain a word line and electric potential of the substrate, is not required and only necessitates a level shifter as shown in FIG. 4 so as for the high voltage and low voltage to be employed as a gate potential for PMOS 50 and NMOS 52.

When the row address strobe signal RASB is turned to a low level as shown in FIG. 6H, the low address signal Ai is latched and then decoded by the predecoder 32. Of the predecoded signals the most significant bit is converted to a signal MSi which serves to select the memory cell array.

Figure 6A:
Figure 6B:
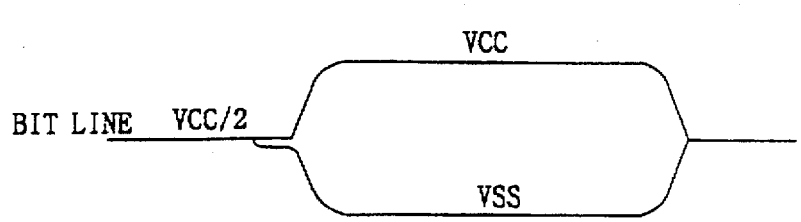
Figure 6F:
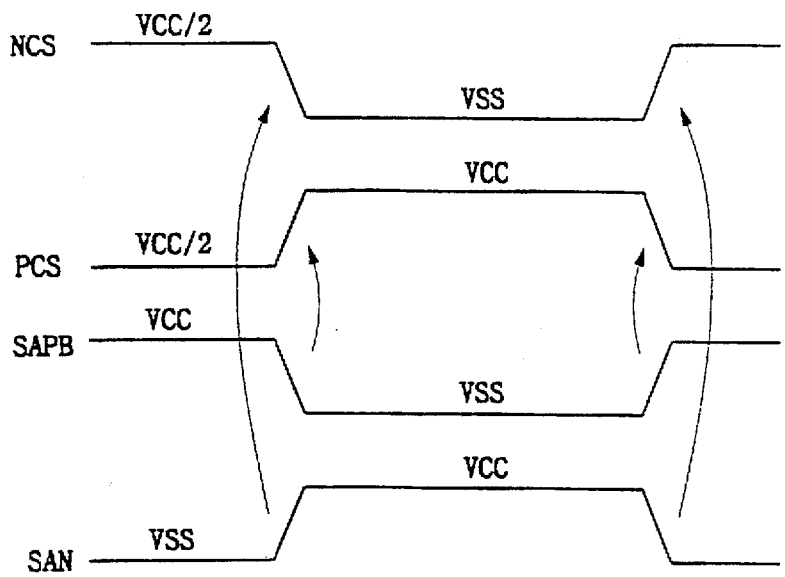
Figure 6G:
Figure 6J:
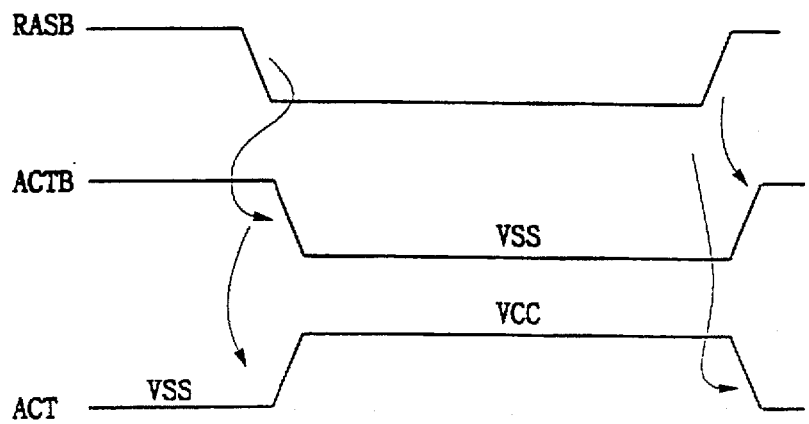

Subsequently, as shown in FIG. 6H, the switch control signal generator 38 of the level shifter outputs the switch control signal ACTB, and the switch control signal generator 40 outputs the switch control signal ACT at a ground voltage level, thereby turning on PMOS 50 and NMOS 52, and voltage is supplied to the sense amplifier. In accordance with signals as shown in FIGS. 6A–6G, a word line and a bit line are selected and accordingly the sense amplifier is operated.

Thereafter, when the row address strobe signal RASB is turned to a high level, the switch control signal generator 38 outputs a switch control signal ACTB at a level of high voltage Vpp, and the switch control signal generator 40 outputs a switch control signal ACT at a low voltage level, whereby source voltage is not applied to the sense amplifier.

As described above, the sense amplifier circuit according to the present invention secures a faster test time in designing a circuit because a conventional sense amplifier adopting voltage 3.3V can be applied to a semiconductor memory device requiring a potential of less than 1.0V, and also prevents current leakage at a low threshold voltage by providing source voltage to a sense amplifier of a selected memory cell array in an active mode as well as in a standby mode.

What is claimed is:

1. A circuit for a low voltage sense amplifier, comprising:
 a PMOS transistor to a gate of which is applied a first switch control signal output from a level shifter, and to a source of which is applied a supply voltage;

a plurality of PMOS transistors to a respective source of which is connected a drain of the PMOS transistor, and to a respective gate of which is applied a first sense amplifier driving control signal;

a plurality of sense amplifiers to a respective terminal of which is connected a corresponding one of the plurality of PMOS transistors, and each of which includes a plurality of sense amplifying latches;

a plurality of NMOS transistors to a respective gate of which is applied a second sense amplifier driving control signal, and to a respective drain of which is connected a corresponding one of the plurality of sense amplifiers; and an NMOS transistor to a gate of which is applied a second switch control signal output from the level shifter, to a drain of which is connected each of sources of the plurality of NMOS transistors, and to a source of which is connected a ground voltage.

2. The circuit of claim 1, wherein the level shifter according to the present invention, comprises:

an address buffer for receiving and buffering an address signal;

a predecoder for decoding an output signal of the address buffer;

a row address strobe signal buffer for buffering a row address strobe signal;

a logic operator for logically operating an output signal of the row address strobe signal buffer and an output signal of the predecoder;

a first switch control signal generator for generating a switch control signal in accordance with an output signal of the logic operator; and a second switch control signal generator for generating a switch control signal in accordance with an output signal of the logic operator.

3. The circuit of claim 2, wherein the logic operator, comprises:

a first NAND gate for NANDing an output signal of the row address strobe buffer and an output signal of the predecoder; and a second NAND gate for NANDing an output signal of the first NAND gate and a signal delayed by passing from the first NAND gate through an even pair of inverters.

4. The circuit of claim 2, wherein the first switch control signal generator, comprises:

a first inverter for inverting an output signal of the logic operator;

a first PMOS transistor and a first NMOS transistor serially connected to each other, to a respective gate of which is applied an output signal of the logic operator;

a second PMOS transistor to a source of which is applied a high voltage, and to a drain of which is connected a source of the first PMOS transistor;

a third PMOS transistor to a source of which is applied a high voltage, and a gate of which is coupled to each drain of the first PMOS transistor and the first NMOS transistor;

a second NMOS transistor and a fourth PMOS transistor to a respective gate of which is applied an output signal of the first inverter, and which are serially connected to the third PMOS transistor;

a second inverter for inverting a signal commonly applied thereto from a drain of the fourth PMOS transistor, a drain of the second NMOS transistor and a gate of the second PMOS transistor, thereby outputting the first switch control signal.

5. The circuit of claim 2, wherein the second switch control signal generator, comprises:

a first inverter for inverting an output signal of the logic operator;

a first PMOS transistor and a first NMOS transistor serially connected to each other, to a respective gate of which is applied an output signal of the logic operator;

a second NMOS transistor to a drain of which is connected a source of the first NMOS transistor, and to a source of which is applied a low voltage;

a second PMOS transistor and a third NMOS transistor serially connected to each other, to a respective gate of which is applied an output signal of the first inverter;

a fourth NMOS transistor to a drain of which is connected a source of the third NMOS transistor, to a gate of which are commonly connected a drain of the first PMOS transistor and a drain of the first NMOS transistor, and to a source of which is applied a low voltage;

a second inverter for inverting a signal commonly applied thereto from a gate of the second NMOS transistor, a drain of the second PMOS transistor, and a drain of the third NMOS transistor; and a third inverter for inverting an output signal of the second inverter and outputting the second switch control signal.

6. The circuit of claim 1, wherein the supply voltage is provided less than 1.0V.

* * * * *